(12) United States Patent
Schumaker et al.

(10) Patent No.: US 8,345,242 B2
(45) Date of Patent: Jan. 1, 2013

(54) OPTICAL SYSTEM FOR USE IN STAGE CONTROL

(75) Inventors: Philip D. Schumaker, Austin, TX (US); Babak Mokaberi, Cedar Park, TX (US)

(73) Assignee: Molecular Imprints, Inc., Austin, TX (US)

( * ) Notice: Subject to any disclaimer, the term of this patent is extended or adjusted under 35 U.S.C. 154(b) by 436 days.

(21) Appl. No.: 12/580,324

(22) Filed: Oct. 16, 2009

(65) Prior Publication Data

US 2010/0102487 A1 Apr. 29, 2010

Related U.S. Application Data

(60) Provisional application No. 61/108,941, filed on Oct. 28, 2008.

(51) Int. Cl.
| | |
|---|---|
| G01B 11/00 | (2006.01) |
| G01B 15/00 | (2006.01) |
| B41F 1/34 | (2006.01) |
| G01N 21/86 | (2006.01) |
| G01V 8/00 | (2006.01) |
| B29C 45/76 | (2006.01) |

(52) U.S. Cl. ........ 356/399; 356/401; 101/485; 250/548; 250/559.3; 264/40.5; 264/406

(58) Field of Classification Search .................. None
See application file for complete search history.

(56) References Cited

U.S. PATENT DOCUMENTS

| | | | |
|---|---|---|---|
| 4,880,308 A | * | 11/1989 | Shirasu ................ 356/401 |
| 6,204,895 B1 | | 3/2001 | Nakamura et al. |
| 6,580,505 B1 | | 6/2003 | Bareket |
| 6,842,229 B2 | | 1/2005 | Sreenivasan et al. |
| 6,873,087 B1 | | 3/2005 | Choi et al. |
| 6,902,853 B2 | | 6/2005 | Sreenivasan et al. |
| 6,916,584 B2 | | 7/2005 | Sreenivasan et al. |
| 6,921,615 B2 | | 7/2005 | Sreenivasan et al. |
| 6,922,906 B2 | | 8/2005 | Choi et al. |
| 6,954,275 B2 | | 10/2005 | Choi et al. |
| 6,986,975 B2 | | 1/2006 | Sreenivasan et al. |
| 7,027,156 B2 | | 4/2006 | Watts et al. |
| 7,070,405 B2 | | 7/2006 | Sreenivasan et al. |
| 7,119,886 B2 | | 10/2006 | Leenders et al. |
| 7,170,589 B2 | | 1/2007 | Cherala et al. |
| 7,186,483 B2 | | 3/2007 | Sreenivasan et al. |
| 7,281,921 B2 | | 10/2007 | Watts et al. |
| 7,292,326 B2 | | 11/2007 | Nimmakayala et al. |
| 7,303,383 B1 | | 12/2007 | Sreenivasan et al. |
| 7,323,130 B2 | | 1/2008 | Nimmakayala et al. |
| 2003/0112421 A1 | | 6/2003 | Smith |
| 2004/0149687 A1 | | 8/2004 | Choi et al. |
| 2004/0163563 A1 | | 8/2004 | Sreenivasan et al. |

(Continued)

FOREIGN PATENT DOCUMENTS

JP        08313842 A   *   11/1996

(Continued)

*Primary Examiner* — Gordon Stock, Jr.
(74) *Attorney, Agent, or Firm* — Cameron A. King

(57) ABSTRACT

Imprint lithography benefits from precise alignment between a template and a substrate during imprinting. A moiré signal resulting from indicia on the template and the substrate are acquired by a system comprising a line-scan camera and a digital micromirror device (DMD) which provides a high bandwidth, low-latency signal. Once acquired, the moiré signal may be used directly to align the template and the substrate without need for discrete position/angle encoders.

9 Claims, 3 Drawing Sheets

U.S. PATENT DOCUMENTS

| | | |
|---|---|---|
| 2004/0257571 A1 | 12/2004 | Mieher et al. |
| 2005/0064344 A1 | 3/2005 | Bailey et al. |
| 2005/0269745 A1 | 12/2005 | Cherala et al. |
| 2005/0270516 A1 | 12/2005 | Cherala et al. |
| 2005/0271955 A1 | 12/2005 | Cherala et al. |
| 2006/0114450 A1 | 6/2006 | Nimmakayala et al. |
| 2006/0115999 A1 | 6/2006 | Sreenivasan et al. |
| 2007/0228610 A1 | 10/2007 | Sreenivasan et al. |
| 2007/0231421 A1 | 10/2007 | Nimmakayala et al. |
| 2007/0243655 A1 | 10/2007 | Schmid et al. |
| 2008/0153312 A1 | 6/2008 | Sreenivasan et al. |
| 2009/0026657 A1 | 1/2009 | Nimmakayala et al. |
| 2009/0147237 A1 | 6/2009 | Schumaker et al. |

FOREIGN PATENT DOCUMENTS

| | | |
|---|---|---|
| WO | WO 2006/024908 A2 | 3/2006 |
| WO | WO 2007/123249 A2 | 11/2007 |

\* cited by examiner

OPTICAL SYSTEM FOR USE IN STAGE CONTROL

PRIORITY AND RELATED APPLICATION

The present application claims priority to and is related to U.S. Provisional Application Ser. No. 61/108,941, entitled, "Optical System For Use in Stage Control" filed on Oct. 28, 2008; which is incorporated by reference herein for all that it teaches and discloses.

BACKGROUND

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976; U.S. Patent Application Publication No. 2004/0065252; and U.S. Pat. No. 6,936,194, entitled "Functional Patterning Material for Imprint Lithography Processes," all of which are hereby incorporated by reference.

An imprint lithography technique disclosed in each of the aforementioned U.S. patent publications and patent, includes formation of a relief pattern in a polymerizable layer and transferring a pattern corresponding to the relief pattern into an underlying substrate. The substrate may be substantially transparent to light. The substrate may be coupled to a motion stage to obtain a desired positioning to facilitate the patterning process. The patterning process uses a template spaced-apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced-apart. The substrate and the solidified layer are then subjected to additional processes to transfer a relief image into the substrate that corresponds to the pattern in the solidified layer.

During imprint lithography precise alignment of the substrate relative to the template is desired to minimize production defects. Typically this alignment may involve complicated or expensive interferometric devices which are difficult and expensive to calibrate and maintain. Furthermore, it has proven difficult to obtain adequate imagery of substrates during imprint lithography.

DETAILED DESCRIPTION

Illustrative Architecture

Figure 1:
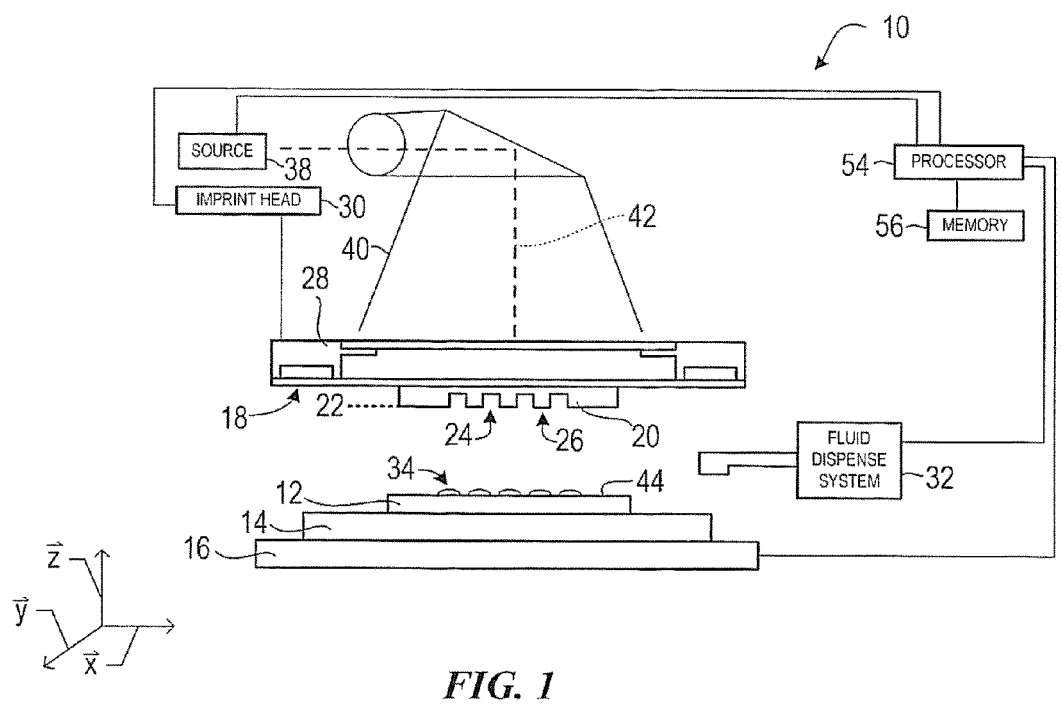
FIG. 1 is a simplified side view of a lithographic system having a mold spaced-apart from a substrate.

Referring to the figures, and particularly to FIG. 1, illustrated therein is a lithographic system 10 used to form a relief pattern on a substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is hereby incorporated by reference.

Substrate 12 and substrate chuck 14 may be further supported by stage 16. Stage 16 may provide motion along the x-, y-, and z-axes. Stage 16, substrate 12, and substrate chuck 14 may also be positioned on a base (not shown).

Spaced-apart from substrate 12 is a template 18. Template 18 generally includes a mesa 20 extending therefrom towards substrate 12, mesa 20 having a patterning surface 22 thereon. Further, mesa 20 may be referred to as mold 20. Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to template chuck 28. Template chuck 28 may be configured as, but not limited to, vacuum, pin-type, groove-type, electromagnetic, and/or other similar chuck types. Exemplary chucks are further described in U.S. Pat. No. 6,873,087, which is hereby incorporated by reference. Further, template chuck 28 may be coupled to imprint head 30 such that template chuck 28 and/or imprint head 30 may be configured to facilitate movement of template 18.

System 10 may further comprise a fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 22 and substrate 12 depending on design considerations. Polymerizable material 34 may comprise a monomer mixture as described in U.S. Pat. No. 7,157,036 and U.S. Patent Publication No. 2005/0187339, all of which are hereby incorporated by reference.

Figure 2:
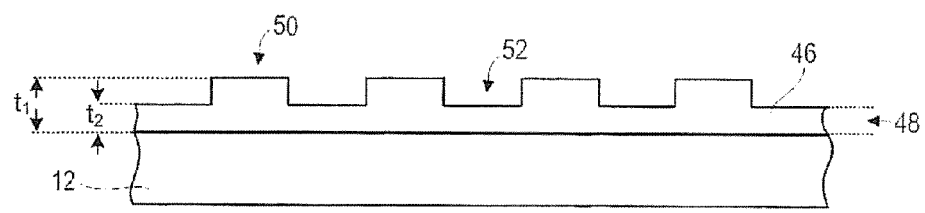
FIG. 2 is a side view of the substrate shown in FIG. 1, having a patterned layer thereon.

Referring to FIGS. 1 and 2, system 10 may further comprise an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Either imprint head 30, stage 16, or both may vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., broadband ultraviolet radiation, causing polymerizable material 34 to solidify and/or cross-link conforming to shape of a surface 44 of substrate 12 and patterning surface 22, defining a patterned layer 46 on substrate 12. Patterned layer 46 may comprise a residual layer 48 and a plurality of features shown as protrusions 50 and recessions 52, with protrusions 50 having thickness t1 and residual layer having a thickness t2.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is hereby incorporated by reference.

One manner in which to locate the polymerizable material 34 between template 18 and substrate 12 may be by depositing a plurality of droplets of polymerizable material 34 on the surface 44 of substrate 12. Thereafter, polymerizable material 34 may be concurrently contacted by both template 18 and substrate 12, spreading polymerizable material 34 on the surface of substrate 12. During this process, orientation or template 18 to substrate 12 may become a factor.

In a further embodiment, the above-mentioned may be employed in any known technique, e.g., photolithography (various wavelengths including G line. I line, 28 nm, 193 nm, 157 nm, and 13.2-13.4 nm), contact lithography, e-beam lithography, x-ray lithography, ion-beam lithography and atomic beam lithography.

Current imprint lithography systems and methods, as described in United States Patent Application Publication No. 2005/0270312, filed as U.S. patent application Ser. No. 11/143,092 entitled "Fluid Dispensing and Drop-On-Demand Dispensing for Nano-Scale Manufacturing" and United States Patent Application Publication No. 2005/0106321, filed as U.S. patent application Ser. No. 10/714,088 entitled "Dispense Geometry to Achieve High-Speed Filling and Throughput," both of which are incorporated by reference herein, use drop-on-demand technology to place drops of polymerizable material on a substrate before imprinting. The fluid dispenser dispenses fluid in discrete volumes and at discrete locations. This method is useful for any imprint system using drop-on-demand application with these constraints.

Optical System

Figure 3:
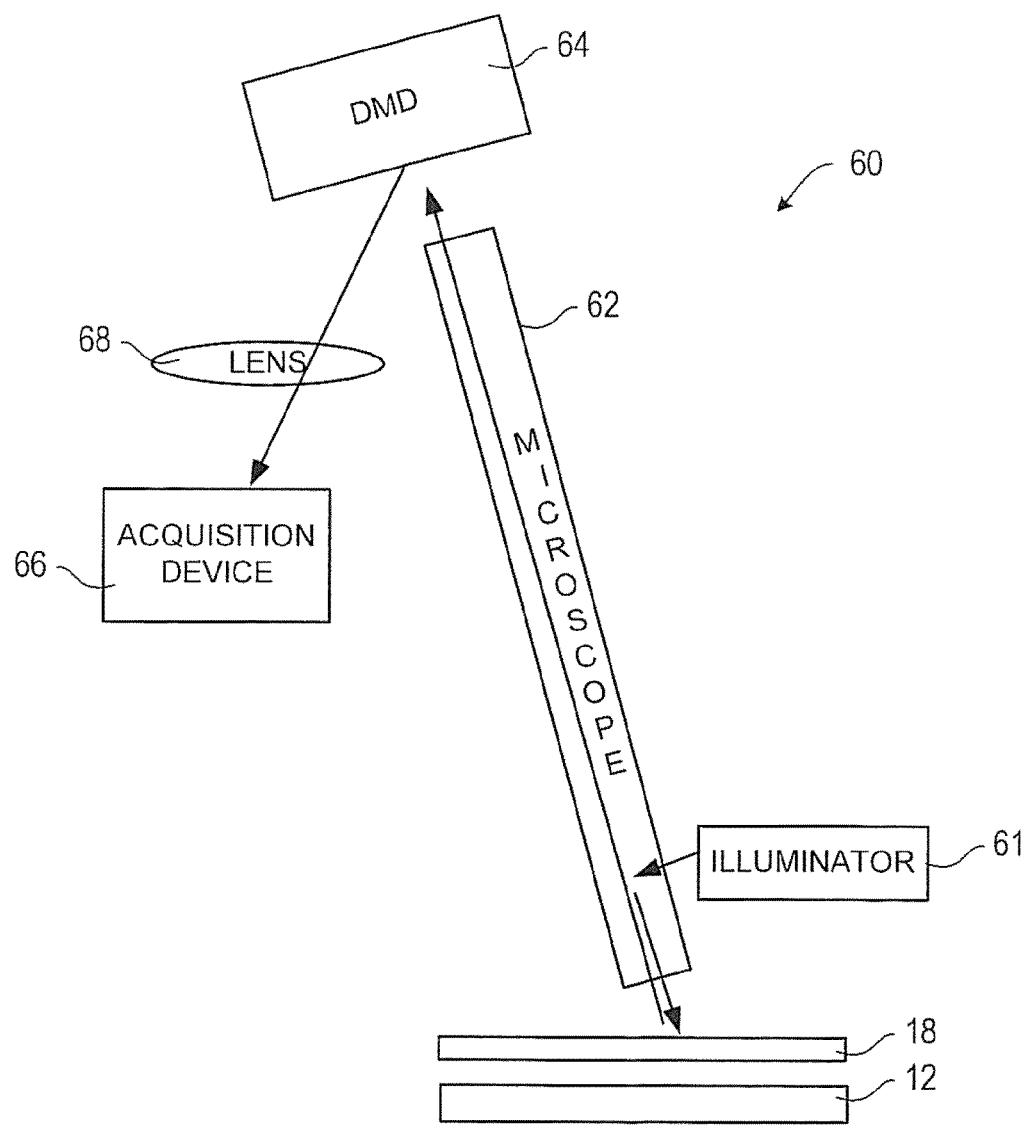
FIG. 3 illustrates an exemplary optical system for providing imaging of template and substrate during the imprint process.

FIG. 3 illustrates an exemplary optical system 60 for providing imaging of template 18 and/or substrate 12 prior to and during the imprint process. For example, optical system 60 may provide real-time or near-real-time imaging of template 18, substrate 12, or both to facilitate alignment of template 18 and substrate 12 through movement of stage 16 (shown in FIG. 1). In other implementations, the stage 16 may remain stationary while the template 18 moves.

Optical system 60 may comprise a microscope 62, an illuminator 61, a digital micromirror device (DMD) 64, and an acquisition device 66. An exemplary DMD 64 includes the DMD Discovery manufactured by Texas Instruments, a corporation located in Dallas, Tex. DMD 64 may be optically coupled to microscope 62 to acquire light from template 18, substrate 12, or both. Processor 54 (shown in FIG. 1) may control and manage DMD 64.

Light from illuminator 61 illuminates the template 18 and the substrate 12. Template 18 may contain reference markings, surface features, or other indicia which may be used for alignment. Substrate 12 may also contain reference markings, surface features, or other indicia which may be used for alignment. When illuminated, the combination of template 18 and substrate 12 reference markings may produce moiré patterns.

Light from a particular area on the template 18, substrate 12, or both, may be reflected by the DMD 64 towards acquisition device 66. The ability to address specific micromirrors on the DMD 64 in conjunction with the high switching speed allows a high data transfer rate and high rates of data acquisition, as well as the ability to selectively redirect light for flexibility in sampling.

In some implementations, light from multiple areas on the template 18, substrate 12, or both may be directed to the acquisition device 66. For example, where the acquisition device 66 comprises a line-scan camera having a one-dimensional array of detection elements, DMD 64 may direct light from several areas on the template 18, substrate 12, or both to the array. Line-scan cameras provide scan rates in the kilohertz range, suitable for use with the DMD 64.

These several areas may be adjacent to one another, and may also be contiguous, such as when the DMD 64 is providing a raster scan of the template 18, substrate 12, or both. However, in other implementations the several areas may not be adjacent or contiguous. For example, DMD 64 may direct light from several disparate areas onto the acquisition device 66. Thus, the light from a first area may be directed via the DMD to a first detector, while light from a second area may be directed via the DMD to a second detector, and so forth, with light from each area sampled being directed to a different detector. In other implementations, light from multiple areas may be directed to a single detection element.

Acquisition device 66 may be a detector which is sensitive to incoming light. In accordance with the wavelength and intensity of light, different detectors may be used. For example, when visible light is used, acquisition device 66 may be a charge coupled device (CCD) or complementary metal oxide semi-conductor (CMOS). In other implementations detectors may include microbolometers, photomultiplier tubes, multi-anode microchannel arrays, and so forth. Detectors may include a single detection element, a one-dimensional array of detection elements such as in a line-scan camera, or a two-dimensional array of detection elements such as in a CCD chip.

Where a single detector is used, overall bandwidth of the optical system 60 may be limited by the update rate of the DMD 64 and the detection interval of the detector. Update rate of the DMD 64 is the time interval required to redirect a micromirror and thus redirect incoming incident light. Detection interval is the minimum time in which the detector can receive incoming electromagnetic radiation and generate an output.

Optical system 60 may comprise a lens 68 located between DMD 64 and acquisition device 66 suitable for focusing light onto the detector within the acquisition device 66. Generally, microscope 62 may provide imagery to DMD 64. As used in this application, imagery comprises individual pixels as well as array of pixels forming a picture. Each pixel is representative of light from a specific area.

A coding scheme may be provided. For example, a coding scheme relying on the property that moiré signals are sparse in the Fourier domain may be used to compressively code images. Exemplary coding schemes are described in detail in Duarte et al., Single-pixel imaging via compressive sampling, IEEE Signal Processing Magazine, 25(2), March 2008, at 83, and Marcia, et al., Acoustics, Speech and Signal Processing, IEEE International Conference, Mar. 31, 2008, ICASSP 2008, each of which is hereby incorporated by reference.

Stage Control

Figure 4:
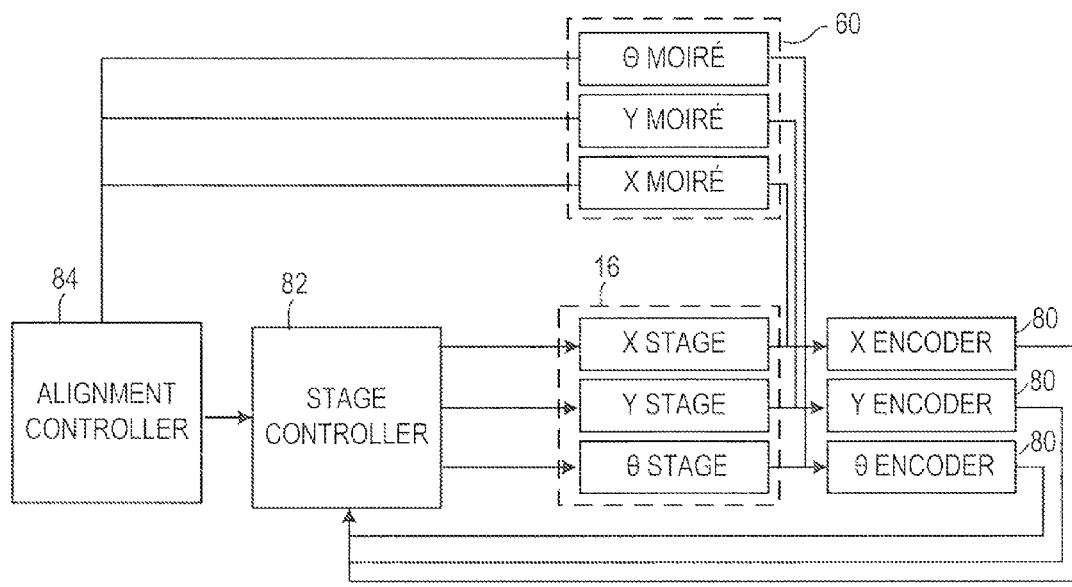
FIG. 4 illustrates a block diagram of an exemplary method for controlling movement of a stage using stage encoders to provide feedback to a stage controller.

Because template 18, substrate 12 or both may move during production, precise alignment between the two is desirable to minimize, if not prevent, production defects. Movement may include translation in a plane comprising two orthogonal axes (X, Y), rotation (θ) about an axis orthogonal to the plane, or both. As illustrated in FIG. 4, current practice uses encoders 80 for sensing the position of stage 16 during imprint lithography. These encoders may be optical encoders or interferometers.

The system of FIG. 4 determines a current position of stage 16 with encoders 80 which provide information to a stage controller 82. However, this system involves a processing delay introduced by the encoders 80 as well a corresponding expense and difficulty in maintaining and calibrating those encoders 80.

Figure 5:
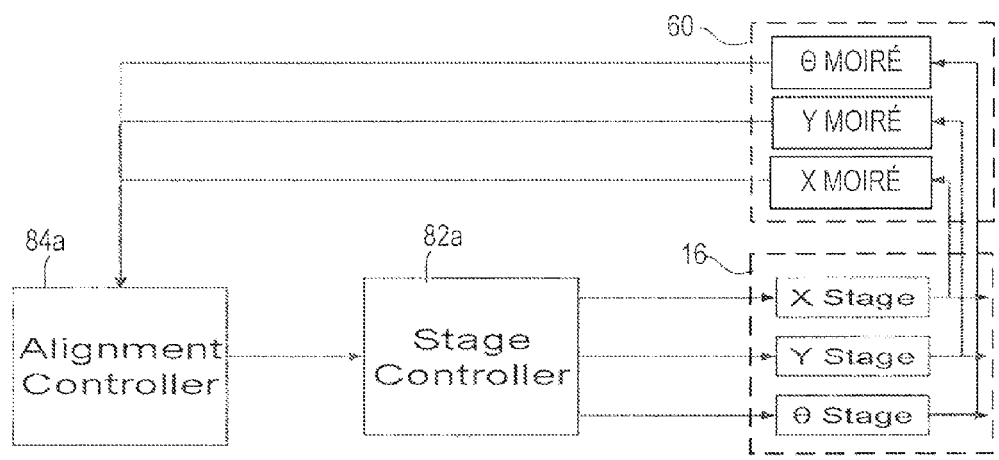
FIG. 5 illustrates a block diagram of an exemplary method for controlling movement of a stage using moiré patterns and without reference to dedicated stage encoders.

FIG. 5 illustrates a flow diagram of the use of moiré patterns to provide information enabling the movement of stage 16 to precisely align the template 18 and substrate 12 with one another without the use of encoders 80. As described above, the template 18 and substrate 12 each have reference markings. When illuminated, these reference markings generate a moiré pattern. Exemplary pattern detection methods are described in detail in U.S. Patent Publication No. 2004/0189996, which is hereby incorporated by reference.

Because the moiré pattern varies predictably with the extent of the misalignment, relative displacements necessary to result in desired alignment may thus be calculated. Thus, the moiré pattern may be directly employed to provide positioning information about the stage 16 and drive movement of stage 16 without the use of encoders 80. Significant reductions in convergence times of X, Y, and B alignment may be realized by directly using moiré patterns. Additionally, an alignment steady-state value may be reduced into the sub 5 nanometer level. Furthermore, X, Y, and θ movement of stage 16 may realize a more stable closed loop control.

For example, as optical system 60 provides images of template 18 and substrate 12 in about real-time, alignment controller 84a processes X moiré, Y moiré, and θ moiré patterns to provide positioning information of stage 16. As alignment controller 84a provides displacement information and the current position of stage 16, stage controller 82a may adjust the stage to bring the template 18 and substrate 12 into alignment. In some implementations, stage controller 82a may act in an open loop jogging mode.

Further, by using moiré patterns without the use, or with mitigated use or encoders 80, sensing of stage 16 may be localized and result in improved feedback loop performance. Dramatic improvements in alignment feedback loop performance are realized with this because the moiré pattern observed directly from the area of interest which is undergoing the alignment. In other words, the relative alignment is sensed at a highly relevant location.

It is worthwhile to note that in some implementations existing encoders 80 are not required to be removed to benefit from this moiré pattern alignment method. For example, where encoders 80 are present their output may be mitigated or used as a secondary input.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A method of aligning a template and a substrate, the method comprising:
    scanning the substrate through the template with a digital micromirror device (DMD), wherein the substrate and the template have corresponding features;
    measuring a moiré signal resulting from interaction of light between the features on the substrate and the template; and
    determining a misalignment based on the measured moiré signal,
    wherein the DMD directs light from an area on the substrate, the template, or both to a detector element.

2. The method of claim 1 further comprising adjusting alignment between the substrate and the template in response to the determined misalignment.

3. The method of claim 1 wherein the DMD directs light from a plurality of non-contiguous areas on the substrate to a plurality of detector elements such that each of the non-contiguous areas corresponds to one detector element.

4. The method of claim 1 wherein the alignment comprises moving the template or the substrate or both in a plane comprising two orthogonal axes, rotating about an axis orthogonal to the plane, or both.

5. An imprint lithography system, the system comprising:
    a template configured to render an imprint and comprising alignment indicia;
    a substrate configurable to replicate the imprint and comprising alignment indicia;
    an illuminator configured to illuminate the template and the substrate;
    a detector; and
    a digital micro-mirror device comprising a plurality of individually addressable micro-mirrors configurable to reflect at least a portion of light from the template and the substrate to the detector, wherein the light comprises a moiré pattern resulting from an interaction between the alignment indicia of the template and the alignment indicia of the substrate.

6. The system of claim 5 wherein the detector comprises a plurality of detection elements and light from each of a plurality of non-contiguous areas on the template, or the substrate, or both is directed to separate detection elements.

7. The system of claim 5 wherein the moiré pattern is used as an in situ measurement of a relative alignment error between the template and the substrate.

8. The system of claim 5 wherein the substrate is substantially transparent to the light.

9. The system of claim 5 further comprising:
    an alignment controller configured to output displacement information and a current position based on the moiré pattern of a stage upon which the substrate is mounted; and
    a stage controller configured to accept the alignment controller output and control the stage.

* * * * *